United States Patent
Noguchi et al.

(10) Patent No.: US 6,960,966 B2
(45) Date of Patent: Nov. 1, 2005

(54) SURFACE ACOUSTIC WAVE FILTER WITH ATTENUATION POLES

(75) Inventors: Kazushige Noguchi, Tokyo (JP); Satoshi Terada, Yokohama (JP); Wataru Ohashi, Tokyo (JP); Tomokazu Komazaki, Hachioji (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/668,379

(22) Filed: Sep. 24, 2003

(65) Prior Publication Data

US 2004/0201434 A1 Oct. 14, 2004

(Under 37 CFR 1.47)

Related U.S. Application Data

(60) Provisional application No. 60/441,354, filed on Jan. 22, 2003.

(51) Int. Cl.[7] .................................................. H03H 9/64
(52) U.S. Cl. ..................... 333/193; 333/195; 310/313 B
(58) Field of Search ................................. 333/193–196; 310/313 B, 313 D (56) References Cited

U.S. PATENT DOCUMENTS

| | | | | |
|---|---|---|---|---|
| 4,768,079 A | * | 8/1988 | Kandpal et al. | 257/664 |
| 5,905,418 A | * | 5/1999 | Ehara et al. | 333/193 |
| 6,137,380 A | * | 10/2000 | Ushiroku et al. | 333/193 |
| 6,150,904 A | * | 11/2000 | Taniguchi et al. | 333/193 |
| 6,677,835 B2 | * | 1/2004 | Noguchi et al. | 333/193 |
| 2002/0089396 A1 | * | 7/2002 | Noguchi et al. | 333/193 |

FOREIGN PATENT DOCUMENTS

| | | | |
|---|---|---|---|
| JP | 9-261002 | * | 10/1997 |
| JP | 2002-124847 | * | 4/2002 |

* cited by examiner

Primary Examiner—Barbara Summons
(74) Attorney, Agent, or Firm—Rabin & Berdo, PC (57) ABSTRACT

A high-performance SAW filter is to be provided which has lower insertion loss in a pass band and high attenuation in an attenuation band on the low frequency side of the pass band. In a SAW filter with attenuation poles configured of a two-port circuit for filtering for forming a ladder type SAW filter using a SAW resonator and a two-port circuit for impedance formed of an impedance serially connected, the impedance of the two-port circuit for impedance is configured so as to form an attenuation band of a predetermined width having a sufficient attenuation characteristic on the low frequency side of a pass band.

6 Claims, 9 Drawing Sheets

SURFACE ACOUSTIC WAVE FILTER WITH ATTENUATION POLES

CROSS-REFERENCE TO RELATED APPLICATIONS

This application claims the benefit under 35 USC 119 of U.S. provisional application No. 60/441,354, filed Jan. 22, 2003.

BACKGROUND OF THE INVENTION

The present invention relates to a band-pass filter of a ladder type configuration using a surface acoustic wave (SAW) resonator in small-sized mobile communication devices such as mobile telephones, particularly to a SAW filter with attenuation poles having high attenuation in an attenuation band and low insertion loss in a pass band.

In recent years, mobile communication device terminals such as small-sized, lightweight mobile telephones have been developed rapidly. In accordance with this, the realization of reduction in size and of high performance in components to be used is being conducted. In response to this, RF (radio frequency band) components using a SAW filter are developed and used. Particularly, the SAW filter is developed actively to partly become commercially available because it is a device that greatly contributes to the realization of reduction in size of RF parts.

In order to enhance the performance of the mobile communication device terminals, a high-performance SAW filter is demanded which has lower insertion loss in a pass band and high attenuation in attenuation bands.

The high-performance SAW filter is used in components for branching, inputting and outputting signals in the mobile communication device terminals.

A traditional ladder type SAW filter forming the high-performance SAW filter is described in Band pass filter with low loss using SAW resonators, Sato, et al., IEICE Ronbunshi A, vol. J76-A, No. 2, pp. 245–252 (1993).

Figure 12:
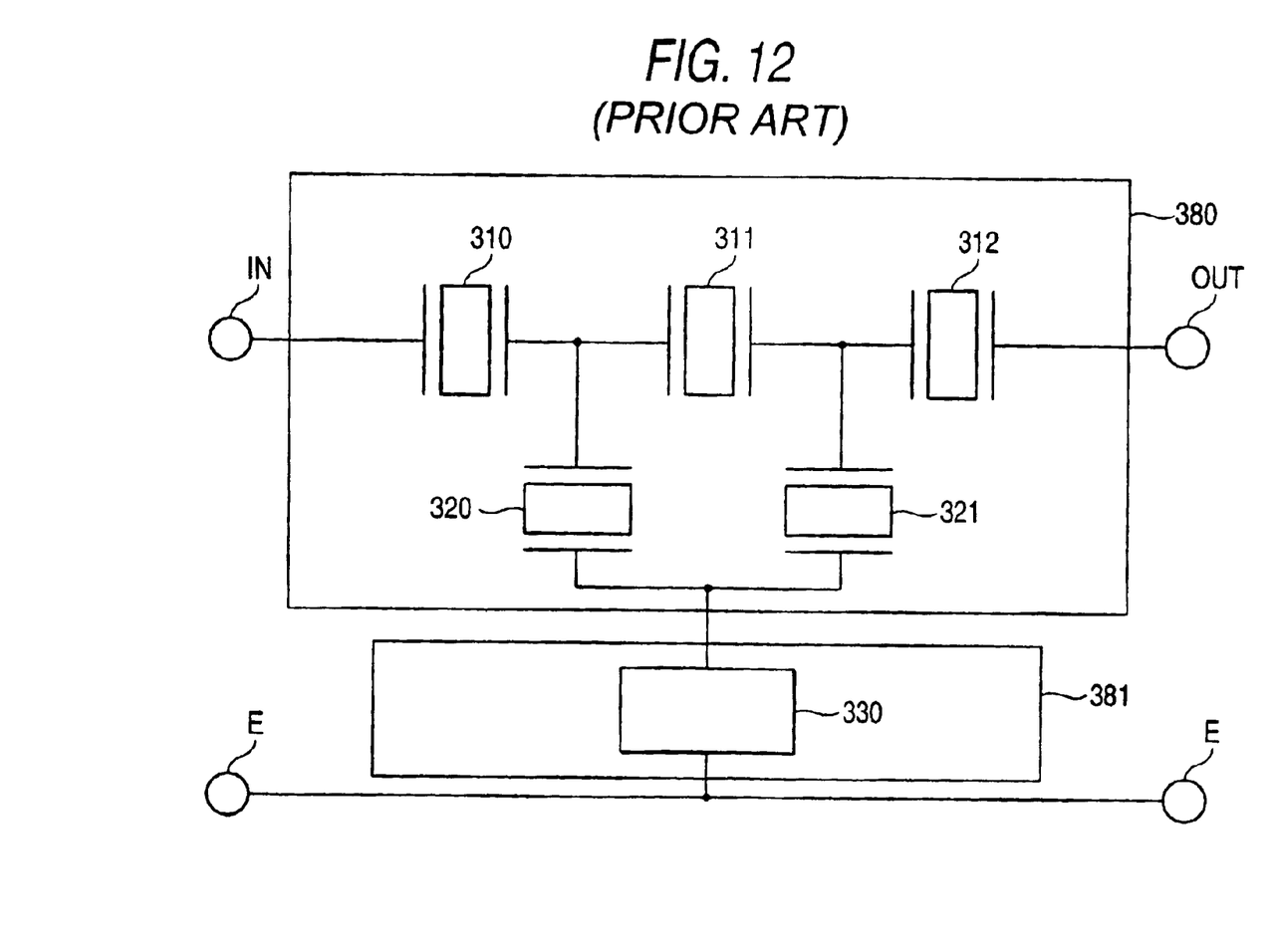
FIG. 12 is a diagram illustrating a circuit configuration in which a two-port circuit 380 of a ladder type SAW filter formed of three series arms 310, 311, and 312 and two shunt arms 320 and 321 is serially connected to a two-port circuit 381 provided with the attenuation pole inductance 330.

In addition, an attenuation pole filter shown in FIG. 12 added with an attenuation pole inductance L 330 is used as a high-performance filter.

FIG. 12 is a circuit diagram illustrating that a two-port circuit 380 of a traditional ladder type SAW filter formed of three series arms 310, 311, and 312 and two shunt arms 320 and 321 is serially connected to a two-port circuit 381 provided with an attenuation pole inductance 330.

As described in JP-A-10-163808, in the SAW filter with attenuation poles shown in FIG. 12, attenuation poles are formed in an attenuation band on the high frequency side of the pass band by the attenuation pole inductance 330, in addition to the characteristics of the traditional ladder type SAW filter. The attenuation poles can provide certain high attenuation characteristics in the attenuation characteristics on the high frequency side of the pass band.

In order to enhance the performance of the recent mobile communication device terminals, a high-performance SAW filter is demanded which has lower insertion loss in a pass band and high attenuation in the attenuation band on the low frequency side of the pass band. The high performance SAW filter is being investigated with the use of traditional bonding wire, but satisfying characteristics are not obtained yet under present circumstances.

In the traditional mobile communication device terminals such as mobile telephones, a SAW filter with attenuation poles having certain high attenuation characteristics in the attenuation band on the high frequency side of a communication band is shown in FIG. 12.

On this account, the circuit shown in FIG. 12 is used when attenuation poles need to be formed in the attenuation band on the high frequency side, and the traditional bonding wire is used for the attenuation pole inductance L 330 shown in FIG. 12.

In this example, traditional bonding wire is used as the inductance L to vary the frequency of the attenuation poles by this L value, and the characteristics are changed to realize certain high attenuation. However, satisfying characteristics cannot be obtained yet.

Furthermore, high attenuation characteristics are demanded in the attenuation band on the low frequency side, and attenuation poles need to be formed in the band. However, the traditional bonding wire is also used in the case. As a SAW filter with attenuation poles responding to this, a film is used in which the attenuation pole frequency of the attenuation band on the low frequency side of the pass band is adjusted by using the traditional bonding wire of the shunt arms in the ladder type SAW filter. However, required characteristics are not satisfied in this case as well. However, the traditional bonding wire is also used in the case. As a SAW filter with attenuation poles responding to this, a film is used in which the attenuation pole frequency of the attenuation band on the low frequency side of the pass band is adjusted by using the traditional bonding wire of the shunt arms in the ladder type SAW filter. However, required characteristics are not satisfied in this case as well.

In the mobile communication device terminals such as mobile telephones, a SAW filter with attenuation poles is desired which has high attenuation characteristics in the attenuation bands on the low frequency side and the high frequency side of the pass band. As a SAW filter with attenuation poles responding to this, a SAW filter with attenuation poles is used in which the traditional bonding wire is used as the inductance, an attenuation pole frequency is formed in the attenuation band on the low frequency side of the pass band, and the attenuation pole frequency is varied to provide high attenuation in the filter characteristics. However, the required characteristics are not satisfied.

SUMMARY OF THE INVENTION

In view of the problems mentioned above, an object of the invention is to provide a high-performance SAW filter having lower insertion loss in a pass band and high attenuation in an attenuation band on the low frequency side of the pass band.

The invention adapts the following schemes for solving the problems.

(1) In a surface acoustic wave filter with attenuation poles configured of a two-port circuit for filtering for forming a ladder type surface acoustic wave filter with a surface acoustic wave resonator; and a two-port circuit for impedance formed of an impedance serially connected, the impedance of the two-port circuit for impedance is configured so as to form an attenuation band of a predetermined width having a sufficient attenuation characteristic on a low frequency side of a pass band.

(2) In the surface acoustic wave filter with attenuation poles as in (1), the impedance of the two-port circuit for impedance is formed of a resistance and an inductance.

(3) In the surface acoustic wave filter with attenuation poles as in (1), the impedance of the two-port circuit for impedance is formed of an impedance of a bonding wire.

(4) In a surface acoustic wave filter with attenuation poles configured of a two-port circuit for filtering for forming a ladder type surface acoustic wave filter with a surface acoustic wave resonator; and a two-port circuit for impedance formed of an impedance serially connected, the two-port circuit for impedance is configured of a π type circuit formed of three impedances so as to form an attenuation band of a predetermined width having a sufficient attenuation characteristic on a low frequency side of a pass band.

(5) In the surface acoustic wave filter with attenuation poles as in (4), a bonding wire is used as the three impedances of the two-port circuit for impedance.

(6) In the surface acoustic wave filter with attenuation poles as in (2), two bonding wires with three electrodes are used as the impedance of the two-port circuit for impedance.

(7) In the surface acoustic wave filter with attenuation poles as in (2), two bonding wires with three electrodes are used for the impedance of the two-port circuit for impedance, and a capacitance is connected in parallel to one of the bonding wires.

(8) In the surface acoustic wave filter with attenuation poles as in any one of (1) to (7), an inductance is set almost constant to 1 nH and a resistance is set to any given value ranging from 0.20 to 1.20 Ω in the impedance.

(9) In the surface acoustic wave filter with attenuation poles as in any one of (1) to (7), an inductance is set almost constant to 0.5 nH and a resistance is set to any given value ranging from 0.10 to 0.60 Ω in the impedance.

BRIEF DESCRIPTION OF THE DRAWINGS

The teachings of the invention can be readily understood by considering the following detailed description in conjunction with the accompanying drawings, in which.

DETAILED DESCRIPTION OF THE INVENTION

Embodiments of the invention will be described in detail based on the drawings.

First Embodiment

Figure 1:
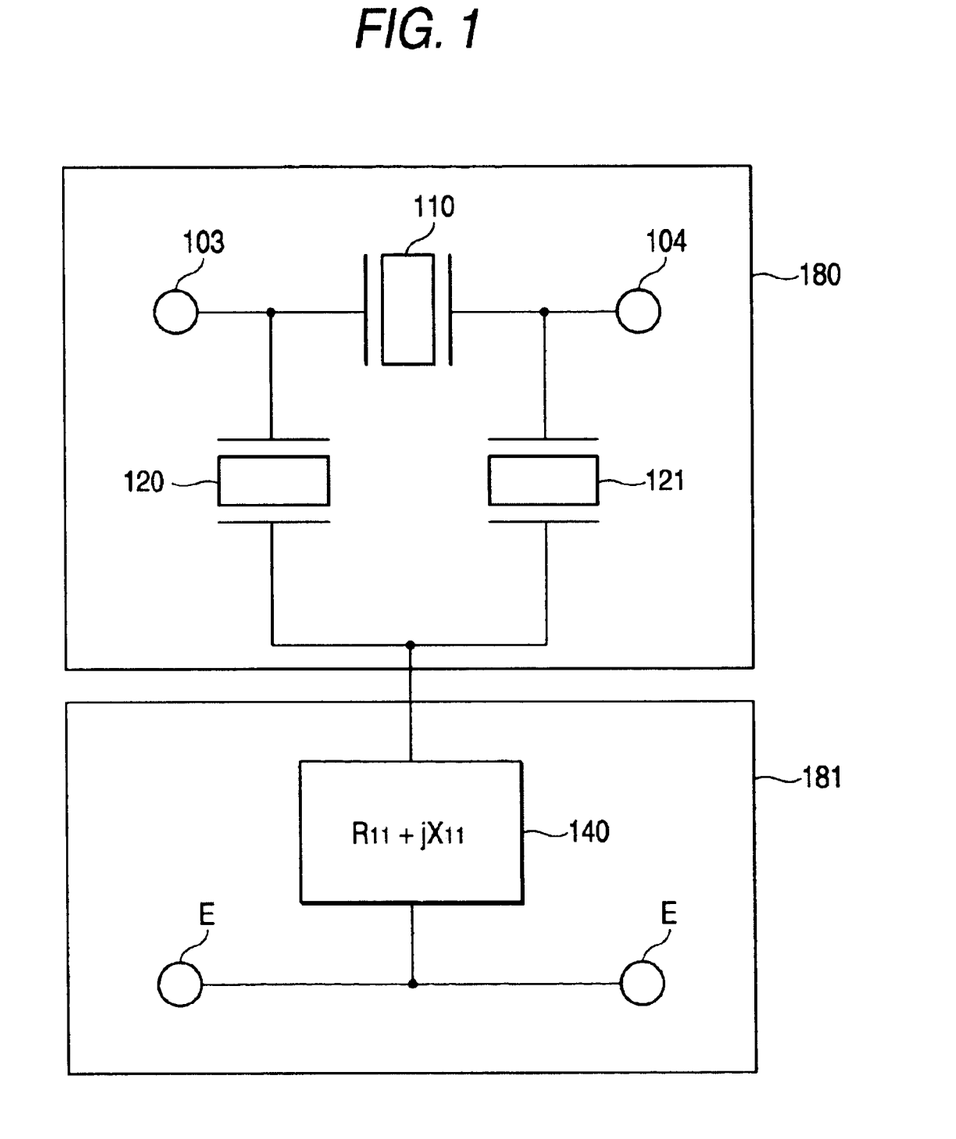
FIG. 1 is a diagram illustrating the circuit configuration of a first embodiment according to the invention.

FIG. 1 is a diagram illustrating the circuit configuration of a first embodiment according to the invention.

The first embodiment is configured in which a two-port circuit for filtering 180 formed of a ladder type SAW filter of two-stage π type is serially connected to a two-port circuit 181 using an attenuation pole impedance $Z_{11}$ 140 serially connecting a resistance $R_{11}$ to an inductance $X_{11}$, as depicted by solid lines in FIG. 1.

More specifically, a series arm S1 110 is serially connected between an input terminal 103 and an output terminal 104, and shunt arms 120 and 121 are connected in parallel to the both ends of the series arm 110 for forming the ladder type SAW filter of two-stage π type.

The two-port circuit for impedance 181 is formed of the attenuation pole impedance $Z_{11}$ 140. The impedance $Z_{11}$ 140 is configured as $R_{11}+jX_{11}$.

The invention is characterized in that the two-port circuit for impedance 181 is configured in which the pole frequency of the attenuation band on the low frequency side can be varied by the real part $R_{11}$ and the imaginary part $X_{11}$ of the attenuation pole impedance $Z_{11}$.

Figure 2:
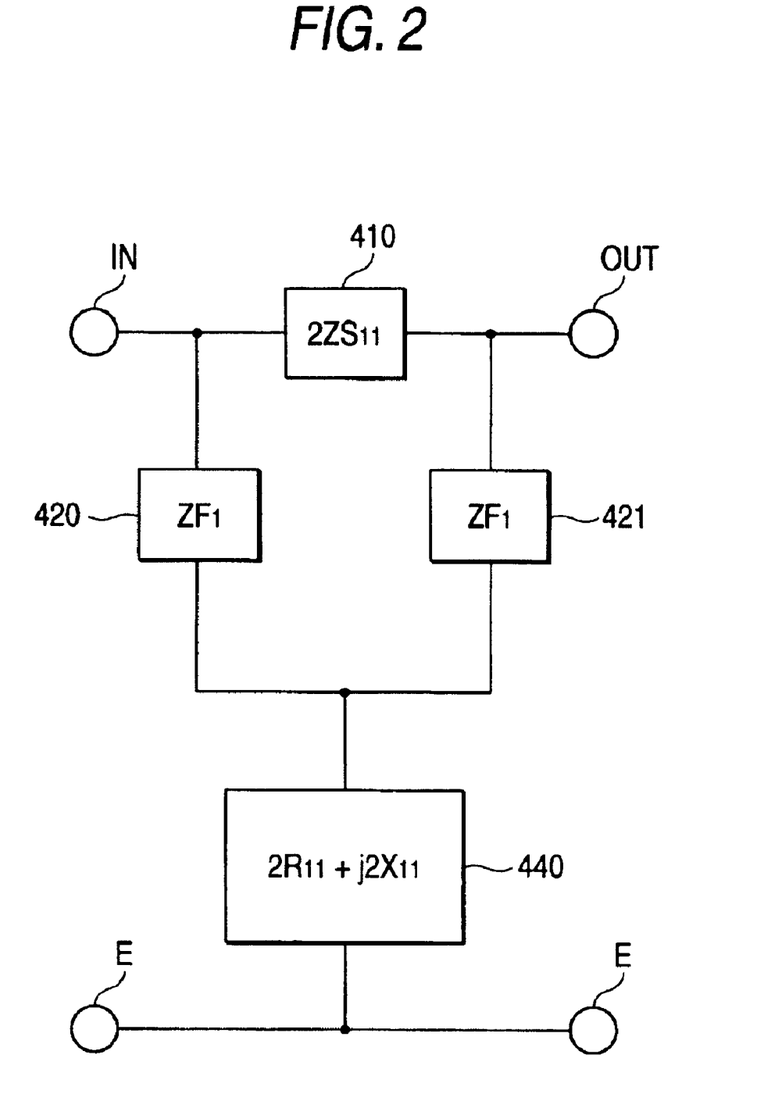
FIG. 2 is a diagram illustrating a lumped constant equivalent circuit of FIG. 1 for describing the first embodiment according to the invention.

FIG. 2 is a diagram illustrating a lumped constant equivalent circuit of FIG. 1 for describing the first embodiment according to the invention.

Figure 3:
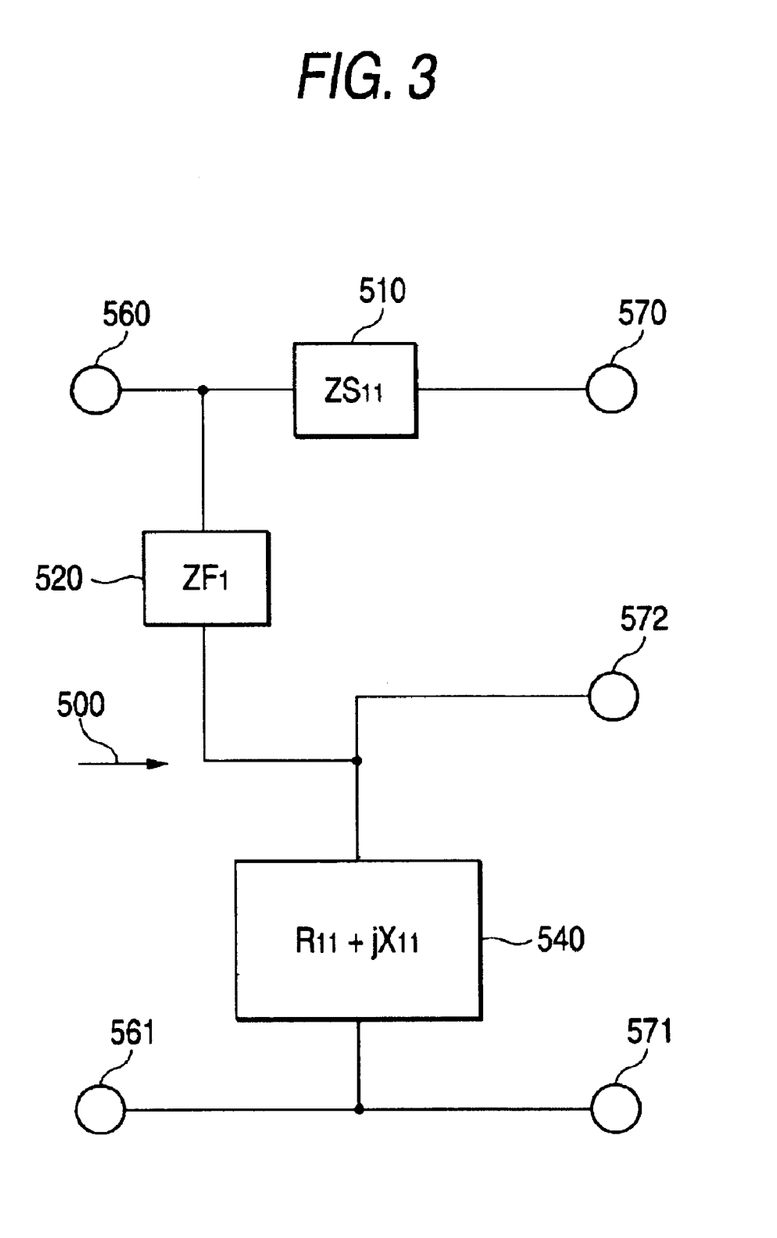
FIG. 3 is a diagram illustrating a half circuit of the lumped constant equivalent circuit shown in FIG. 2 for describing the relationship between the characteristics and component devices of the first embodiment according to the invention.

FIG. 3 is a diagram illustrating a half circuit of the lumped constant equivalent circuit shown in FIG. 2 for describing the relationship between the characteristics and component devices of the first embodiment according to the invention. The lumped constant equivalent circuit shown in FIG. 2 is configured in which a two-port circuit of a π type filter formed of a series arm 410 having an impedance $2ZS_{11}$, and shunt arms 420 and 421, each having an impedance $ZF_1$, is serially connected to a two-port circuit formed of an impedance $Z_{11}$ 440 having $2R_{11}+j2X_{11}$.

In the half equivalent circuit shown in FIG. 3, a series arm $ZS_{11}$ 510 is connected between an input terminal 560 and a terminal 570, a shunt arm 520 having an impedance $ZF_1$ and an impedance 540 having $R_{11}+jX_{11}$ are serially connected between the input terminal 560 and an input terminal 561, and a node between the shunt arm 520 and the impedance $Z_{11}$ 540 is connected to a terminal 572.

In FIG. 3, suppose that the input impedance is $Z_1$ when the terminal 570, the terminal 571 and a terminal 571 are opened, and that the input impedance is $Z_2$ when the terminal 570, the terminal 572, and the terminal 571 are short-circuited. Then $Z_1$ and $Z_2$ are given by Equation (1) and Equation (2), respectively.

$$Z_2 = ZF_1 + R_{11} + jX_{11} \tag{1}$$

$$Z_1 = ZF_1 * ZS_1/(ZF_1 + ZS_1) \tag{2}$$

Figure 4:
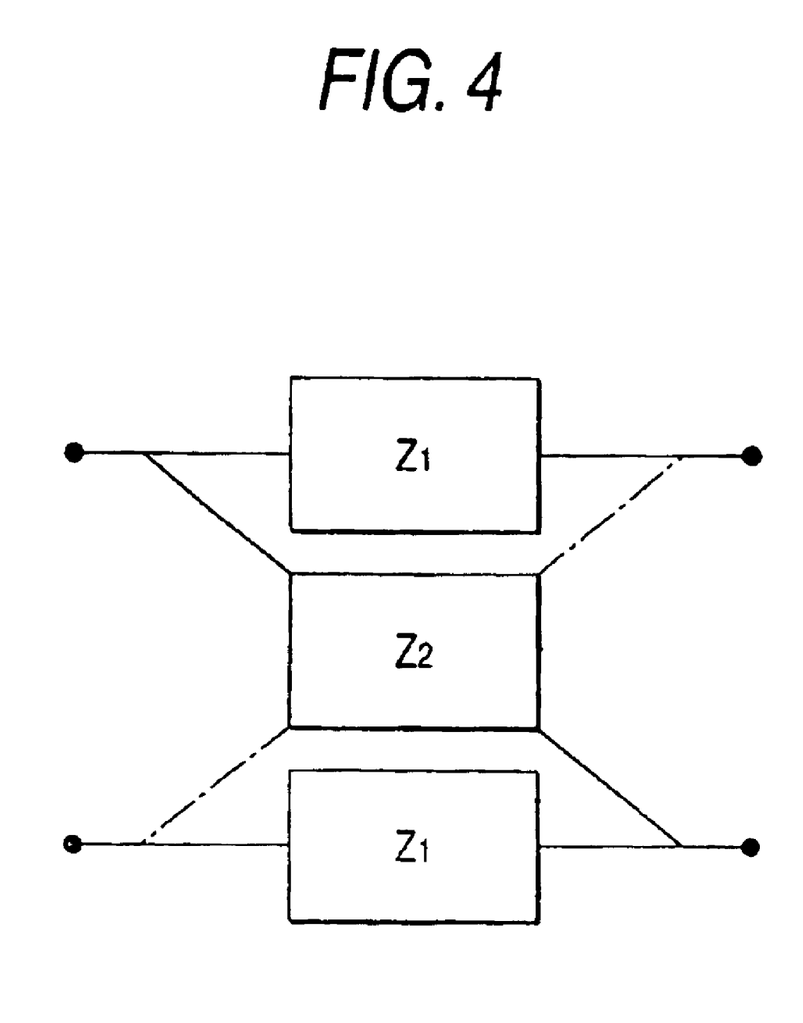
FIG. 4 is a lattice type equivalent circuit of the first embodiment according to the invention.

FIG. 4 is a lattice type equivalent circuit of the first embodiment according to the invention.

The characteristics of the first embodiment can be evaluated by converting the circuit shown in FIG. 1 to the lattice type circuit shown in FIG. 4 in equivalent circuit with $Z_1$ and $Z_2$. An F matrix (four-terminal matrix [F]) in this case can be given by Equation (3).

$$\begin{pmatrix} A & B \\ C & D \end{pmatrix} = \frac{1}{Z_2 - Z_1}\begin{pmatrix} Z_1+Z_2 & 2Z_1Z_2 \\ 2 & Z_1+Z_2 \end{pmatrix} \tag{3}$$

Accordingly, since a coefficient S of operating transmission is $S=(A+B+C+D)/2$ from Equation (3), it is evaluated by using Equation (4).

$$S = \frac{(Z_1 + Z_2) + Z_1 Z_2 + 1}{Z_2 - Z_1} \quad (4)$$

An attenuation characteristic $\alpha(\omega)$ is given by Equation (5).

$$\alpha(\omega) = -20 * \text{LOG}|(S)|(\text{dB}) \quad (5)$$

From Equations (4) and (5), the attenuation pole frequency of the attenuation characteristic $\alpha(\omega)$ is the following case.

In the case of the traditional ladder type SAW filter, it is known that attenuation poles are formed under the conditions that the impedances $Z_2$ and $Z_1$ are infinite and zero.

In addition to the conditions, the invention is characterized in that the attenuation pole frequency is formed also in the case where $Z_2 = Z_1$ and the attenuation pole impedance $Z_{11}$ 140 has a real part and an imaginary part.

In the meantime, the traditional bonding wire only has an inductance and the frequency is formed in the imaginary part alone. More specifically, in the invention, the attenuation characteristic can be changed also in the real part.

Hereinafter, a SAW filter for Cdma-One will be exemplified to describe the usability of the invention.

Table 1 shows the configuration of resonators, the series arm and the shunt arms shown in FIG. 1.

TABLE 1

| Configuration of resonators | Series arm 110 | Shunt arm 120 | Shunt arm u121 |
|---|---|---|---|
| Intersection length (μm) | 60 | 70 | 70 |
| Logarithm | 60 | 80 | 80 |

Table 2 shows the usability of the invention.

TABLE 2

| 1-1. Attenuation pole inductance L is 1 (nH) | | | | | | | | | |
|---|---|---|---|---|---|---|---|---|---|
| 19.0 dB Width | 4 | 14 | 15.8 | 16.1 | 16.2 | 16.1 | 15.9 | 15.5 | 15 |
| R (OHM) | 4.00 | 2.00 | 1.20 | 0.80 | 0.60 | 0.40 | 0.20 | 0.12 | 0.0004 |
| L (nH) | 1 | 1 | 1 | 1 | 1 | 1 | 1 | 1 | 1 |
| Q | 1 | 2.5 | 5 | 7.5 | 10 | 15 | 20 | 50 | 1000 |
| 1-2. Attenuation pole inductance L is 0.5 (nH) | | | | | | | | | |
| 24.0 dB Width | 3 | 8.5 | 9.2 | 9.2 | 9 | 8.9 | 8.8 | 8.5 | 8 |
| R (OHM) | 2.00 | 1.00 | 0.60 | 0.40 | 0.30 | 0.20 | 0.10 | 0.06 | 0.0002 |
| L (nH) | 0.5 | 0.5 | 0.5 | 0.5 | 0.5 | 0.5 | 0.5 | 0.5 | 0.5 |
| Q | 1 | 2.5 | 5 | 7.5 | 10 | 15 | 20 | 50 | 1000 |

Traditionally, as a scheme to obtain high attenuation characteristics, the response is that the bonding wire is used as the attenuation pole inductance L to form attenuation poles in the attenuation band as described in the publicly known document.

More specifically, the resistance value has traditionally been ignored and only the inductance acts as the impedance for attenuation poles in the attenuation band.

In the meantime, as shown in Table 2, the invention can obtain high attenuation characteristics in which at least a resistance component is increased in addition to the impedance of the traditional bonding wire and thus the attenuation pole frequency and the attenuation characteristic can be varied without changing the pass band characteristics.

The bonding wire of the invention is a line that at least a resistance component is increased in addition to the impedance of the traditional bonding wire. The impedances are set to the relationship described below.

Hereinafter, the bonding wire of the invention will first be described based on FIGS. 6 to 9.

Figure 6:
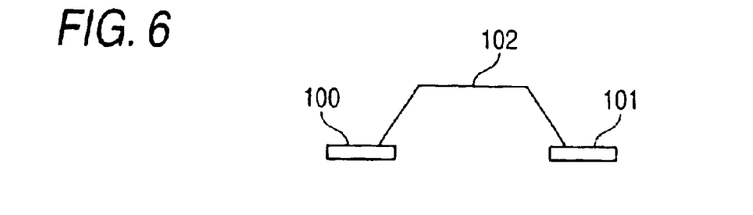
FIG. 6 is a schematic diagram illustrating Example 1 of attenuation pole impedance according to the invention.

FIG. 6 is a schematic diagram illustrating Example 1 of attenuation pole impedance according to the invention.

Figure 7:
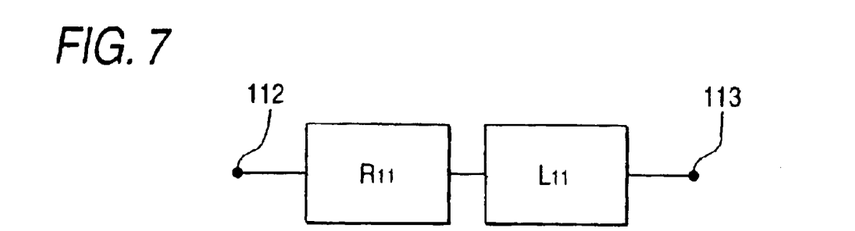
FIG. 7 is a diagram illustrating an equivalent circuit of Example 1 of attenuation pole impedance according to the invention.

FIG. 7 is a diagram illustrating an equivalent circuit of Example 1 of attenuation pole impedance according to the invention.

Figure 8:
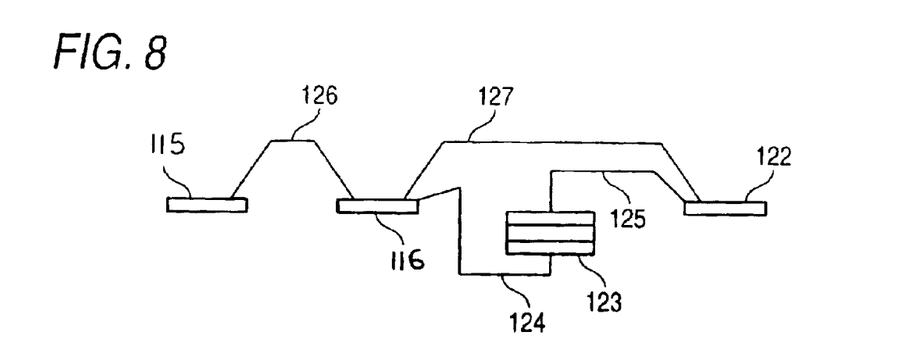
FIG. 8 is a schematic diagram illustrating Example 2 of attenuation pole impedance according to the invention.

FIG. 8 is a schematic diagram illustrating Example 2 of attenuation pole impedance according to the invention.

Figure 9:
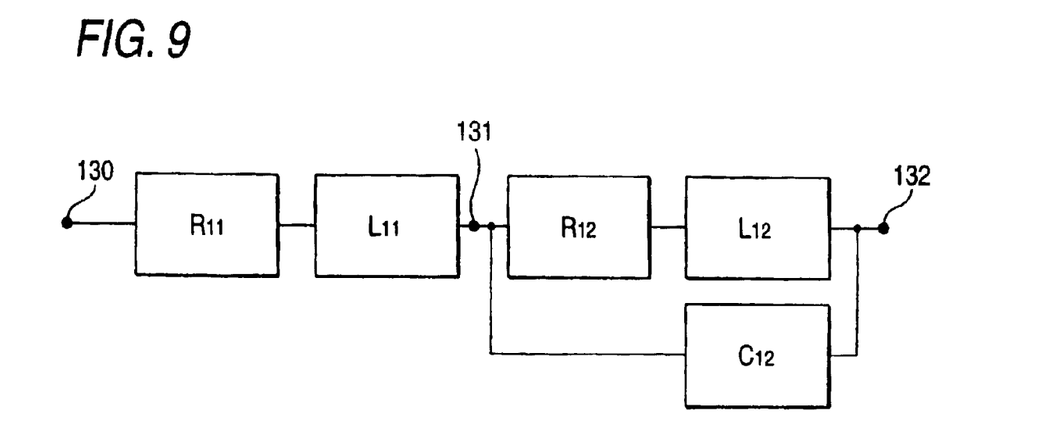
FIG. 9 is a diagram illustrating an equivalent circuit of Example 2 of attenuation pole impedance according to the invention.

FIG. 9 is a diagram illustrating an equivalent circuit of Example 2 of attenuation pole impedance according to the invention.

FIG. 6 is an example of attenuation pole impedance using the bonding wire of the invention. The bonding wire of the invention is formed to be a connecting wire 102, and an electrode on a piezoelectric substrate 100 side is connected to an electrode on a package 101 side.

FIG. 7 depicts an equivalent circuit of FIG. 6, in which an electrode 112 connected to the electrode on the piezoelectric substrate 100 side is connected to an electrode 113 connected to the electrode on the package 101 side by a series circuit formed of a resistance $R_{11}$ and an inductance $L_{11}$. More specifically, it shows that the impedance of the connecting wire 102 formed of the bonding wire of the invention is $R_{11} + j\omega L_{11}$.

Moreover, an example that the reactive component of impedance can be adjusted is shown in FIG. 8. The bonding wire of the invention is formed to be a connecting wire 126 and a connecting wire 127 to connect an electrode on a piezoelectric substrate 115 side, an electrode on a package 116 side, and an electrode on a package 122 side to each other. Furthermore, a capacitance substrate 123 for adjusting the reactive component is connected between the electrode on the package 116 side and the electrode on the package 122 side through normal connecting wires 124 and 125, which have resistance values that can be ignored and are unrelated to the bonding wire of the invention.

FIG. 9 depicts an equivalent circuit of FIG. 8, in which an electrode 130 connected to the electrode on the piezoelectric substrate 115 side is connected to an electrode 131 connected to the electrode on the package 116 side by a series circuit formed of a resistance $R_{11}$ and an inductance $L_{11}$. An equivalent circuit is formed in which the electrode 131 connected to the electrode on the package 116 side is connected to an electrode 132 connected to the electrode on the package 122 by a series circuit formed of a resistance $R_{12}$ and an inductance $L_{12}$. Similarly, an equivalent circuit is formed in which the electrode 131 connected to the electrode on the package 116 side and the electrode 132 connected to the electrode on the package 122 are connected to a capacitance $C_{12}$ through normal connecting wires with resistance values that can be ignored. More specifically, the equivalent circuit is formed in which the electrode 130 is connected to the electrode 131 by the circuit having $R_{11}+j\omega L_{11}$ and the electrode 131 is connected to the electrode 132 by the circuit having $R_{12}+j\omega L_{12}$ and the circuit having $1/j\omega C_{12}$.

As described above, the attenuation pole impedance of the invention is configured as described with FIGS. 6 to 9.

Table 2-1-1 shows the value of attenuation width (MHz) where the attenuation value of the attenuation band on the low frequency side of the pass band is 19.0 (dB) when the attenuation pole impedance $Z_{11}$ is almost constant to the inductance L nearly equal 1 (nH) and the resistance R is a parameter and shows the Q characteristic value of the SAW filter with attenuation poles.

Table 2-1-2 shows the value of attenuation width (MHz) where the attenuation value of the attenuation band on the low frequency side of the pass band is 24.0 (dB) when the attenuation pole impedance $Z_{11}$ is almost constant to the inductance L nearly equal 0.5 (nH) and the resistance R is a parameter and shows the Q characteristic value of the SAW filter with attenuation poles.

Figure 11:
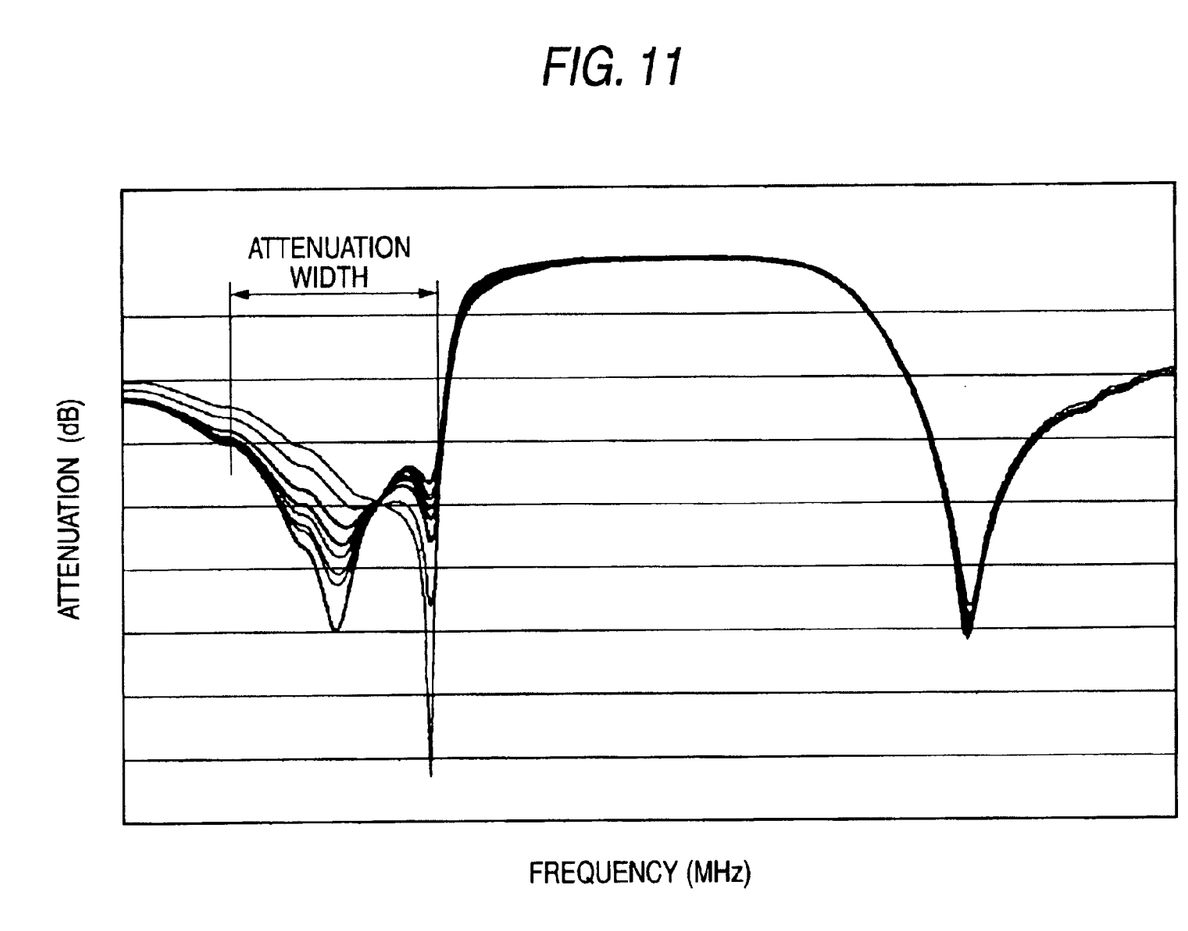
FIG. 11 is a diagram illustrating 'attenuation width' of the invention.

FIG. 11 is a diagram for describing the attenuation width of the invention.

In addition, as shown in FIG. 11, the 'attenuation width' is an interval that the attenuation value of the attenuation band on the low frequency side of the pass band continues at a predetermined value or below. 'Predetermined value' is the value that the attenuation value of the attenuation band on the low frequency side is sufficiently attenuated with respect to the attenuation value of the pass band in practice. Under the present circumstances, the tendency shows the characteristics that can provide sufficient attenuation width, not the characteristics that are greatly attenuated in a narrow range.

Range of Resistance in the First Embodiment

The attenuation value of the attenuation band on the low frequency side of the pass band and the value of attenuation width (MHz) are set to be sufficient values at practical levels. A preferable range of the resistance value to surely clear the conditions at that time is as follows:

1) The range of resistance where L is nearly equal 1 (nH) is 0.20 to 1.20 ($\Omega$).
2) The range of resistance where L is nearly equal 0.5 (nH) is 0.10 to 0.60 ($\Omega$).

Advantage of the First Embodiment

As described above, the first embodiment has high attenuation characteristics in the attenuation band on the low frequency side of the pass band.

The traditional response is that the bonding wire is used as the attenuation pole inductance L in order to realize high attenuation characteristics by providing attenuation poles in the attenuation band in the attenuation band on the low frequency side of the pass band, but satisfying characteristics are not obtained.

In the meantime, as compared with the characteristics of the traditional ladder type SAW filter, the first embodiment according to the invention can obtain required characteristics in which the impedance having the real part is used in the two-port circuit for forming the pole frequency and high attenuation characteristics are obtained by the real part of the resistance component along with the impedance such as the bonding wire.

Second Embodiment

Figure 5:
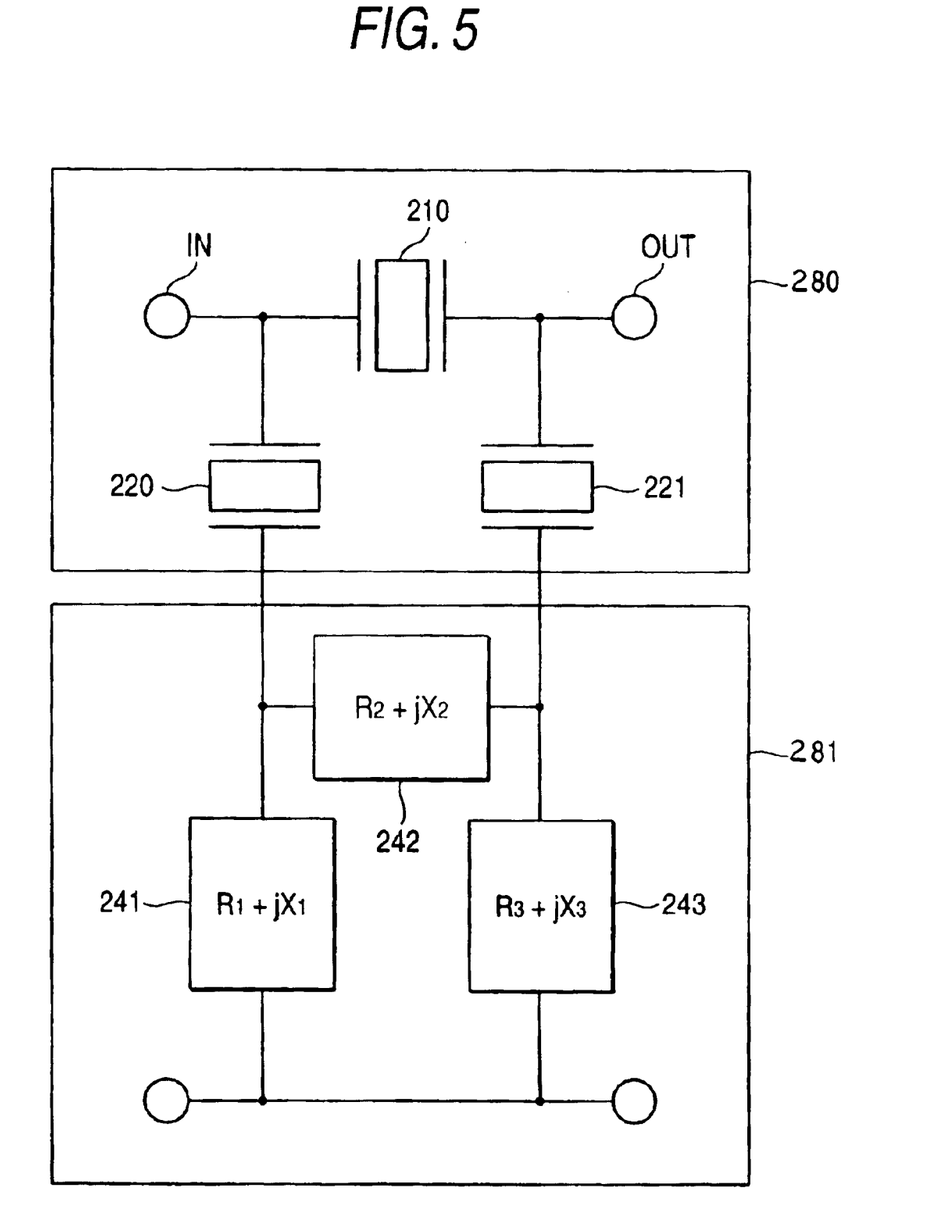
FIG. 5 is a schematic diagram illustrating a second embodiment according to the invention.

FIG. 5 is a schematic diagram illustrating a second embodiment according to the invention.

In the second embodiment, a two-port circuit for filtering 280 is configured as a ladder type SAW filter of the two-stage π type having the same circuit configuration as that of the first embodiment, and a two-port circuit for impedance 281 is configured as a π type circuit using three impedances. Each of three impedances $Z_{21}$ 241, $Z_{22}$ 242 and $Z_{23}$ 243 is configured of a resistance R and an inductance X.

More specifically, the two-port circuit for filtering 280 has one series arm 210 and two shunt arms 220 and 221.

The two-port circuit for impedance 281 is configured as a π type circuit with an attenuation pole impedance $Z_{21}$ 241 having $R_1+jX_1$, an attenuation pole impedance $Z_{22}$ 242 having $R_2+jX_2$ and an attenuation pole impedance $Z_{23}$ 243 having $R_3+jX_3$.

TABLE 3

| Configuration of resonators | series arm 210 | shunt arm 220 | shunt arm 221 |
|---|---|---|---|
| Intersection length (μm) | 60 | 70 | 70 |
| Logarithm | 80 | 80 | 80 |

$$Z_2 = ZF_1 + R_{11} + jX_{11} \quad (6)$$

$$Z_1 = ZF_1 * (ZS_1 + Z_{SS})/(ZF_1 + ZS_1 + Z_{33}) \quad (7)$$

where $Z_{SS} = (R_1+jX_1)*(R_2+jX_2)/(R_1+jx_1+R_2+jX_2)$.

Accordingly, a coefficient S of operating transmission is evaluated by Equation (7) from Equation (6).

$$S = \frac{Z_1 + Z_2 + Z_1 Z_2 + 1}{Z_2 - Z_1} \quad (8)$$

The attenuation characteristic of the second embodiment can be determined by putting Equations (6) and (7) in Equation (8). More specifically, the difference from the first embodiment is in that Equations (6) and (7) are put in Equation (8) for determination because the π type circuit configuration is used in the two-port circuit 2. Accordingly, the pole frequency is a frequency that the denominator of Equation (8) is zero, and the attenuation characteristic becomes high attenuation characteristics, being different from traditional ones.

Hereinafter, the frequency band of the cdmaOne filter will be exemplified to describe the usability of the invention with reference to Table 4. Table 4 shows resonators, the series arm and the shunt arms configuring the circuit shown in FIG. 5.

The upper part of Table 4-2-1 shows the value of attenuation width (MHz) where the attenuation value of the low frequency side of the attenuation band of the pass band is 15.5 (dB) when the attenuation pole impedances $Z_{21}$, $Z_{22}$ and $Z_{23}$ are almost constant to the inductances L1 to L3 nearly equal 0.5 (nH) and the resistance R is a parameter, and shows the Q characteristic value of the SAW filter with attenuation poles.

The lower part of Table 4-2-1 shows the value of attenuation width (MHz) where the attenuation value of the attenuation band on the low frequency side of the pass band is 22.0 (dB) when the attenuation pole impedances $Z_{21}$, $Z_{22}$ and $Z_{23}$ are almost constant to the inductances L1 and L3 nearly equal 0.5 (nH) and to the inductance L2 nearly equal 0.2 (nH) and the resistance R is a parameter, and shows the Q characteristic value of the SAW filter with attenuation poles.

The upper part of Table 4-2-2 shows the value of attenuation width (MHz) where the attenuation value of the attenuation band on the low frequency side of the pass band is 15.5 (dB) when the attenuation pole impedances $Z_{21}$, $Z_{22}$ and $Z_{23}$ are almost constant to the inductances L1 to L3 nearly equal 1.0 (nH) and the resistance R is a parameter, and shows the Q characteristic value of the SAW filter with attenuation poles.

The middle part of Table 4-2-2 shows the value of attenuation width (MHz) where the attenuation value of the attenuation band on the low frequency side of the pass band is 24.1 (dB) when the attenuation pole impedances $Z_{21}$, $Z_{22}$ and $Z_{23}$ are almost constant to the inductances L1 and L3 nearly equal 1.0 (nH) and to the inductance L2 nearly equal 0.2 (nH) and the resistance R is a parameter, and shows the Q characteristic value of the SAW filter with attenuation poles.

The lower part of Table 4-2-2 shows the value of attenuation width (MHz) where the attenuation value of the attenuation band on the low frequency side of the pass band is 17.2 (dB) when the attenuation pole impedances $Z_{21}$, $Z_{22}$ and $Z_{23}$ are almost constant to the inductances L1 and L3 nearly equal 1.0 (nH) and to the inductance L2 nearly equal 0.5 (nH) and the resistance R is a parameter, and shows the Q characteristic value of the SAW filter with attenuation poles.

TABLE 4

| 2-1. Attenuation pole inductance L is 0.5 (nH) | | | | | | | | |
|---|---|---|---|---|---|---|---|---|
| 15.5 dB Width | 9.8 | 10.8 | 12.3 | 13.3 | 13.2 | 13.5 | 12 | 11 |
| R (OHM) | 2.00 | 1.00 | 0.60 | 0.40 | 0.30 | 0.20 | 0.10 | 0.01 |
| L1, L3 | 0.5 | 0.5 | 0.5 | 0.5 | 0.5 | 0.5 | 0.5 | 0.5 |
| L2 | 0.5 | 0.5 | 0.5 | 0.5 | 0.5 | 0.5 | 0.5 | 0.5 |
| Q | 1 | 2.5 | 5 | 7.5 | 10 | 15 | 20 | 1000 |
| 15.5 dB Width | 7.5 | 9.2 | 10 | 10.7 | 10.7 | 11.3 | 10 | 8 |
| R (OHM) | 2.00 | 1.00 | 0.60 | 0.40 | 0.30 | 0.20 | 0.10 | 0.01 |
| L1, L3 | 0.5 | 0.5 | 0.5 | 0.5 | 0.5 | 0.5 | 0.5 | 0.5 |
| L2 | 0.2 | 0.2 | 0.2 | 0.2 | 0.2 | 0.2 | 0.2 | 0.2 |
| Q | 1 | 2.5 | 5 | 7.5 | 10 | 15 | 20 | 1000 |
| 2-2. Attenuation pole inductance L is 1.0 (nH) | | | | | | | | |
| 15.5 dB Width | 18.3 | 20.3 | 23.3 | 26 | 26.4 | 26.8 | 26.7 | 21.5 |
| R (OHM) | 4.00 | 2.00 | 1.20 | 0.80 | 0.60 | 0.40 | 0.20 | 0.01 |
| L1, L3 | 1 | 1 | 1 | 1 | 1 | 1 | 1 | 1 |
| L2 | 1 | 1 | 1 | 1 | 1 | 1 | 1 | 1 |
| Q | 1 | 2.5 | 5 | 7.5 | 10 | 15 | 20 | 1000 |
| 15.5 dB Width | 4.4 | 6.6 | 8.3 | 8.7 | 8.8 | 8.9 | 8.7 | 6.5 |
| R (OHM) | 4.00 | 2.00 | 1.20 | 0.80 | 0.60 | 0.40 | 0.20 | 0.01 |
| L1, L3 | 1 | 1 | 1 | 1 | 1 | 1 | 1 | 1 |
| L2 | 0.2 | 0.2 | 0.2 | 0.2 | 0.2 | 0.2 | 0.2 | 0.2 |
| Q | 1 | 2.5 | 5 | 7.5 | 10 | 15 | 20 | 1000 |
| 15.5 dB Width | 12.3 | 14.3 | 17.2 | 19.1 | 19.5 | 19.8 | 19.7 | 16 |
| R (OHM) | 4.00 | 2.00 | 1.20 | 0.80 | 0.60 | 0.40 | 0.20 | 0.01 |
| L1, L3 | 1 | 1 | 1 | 1 | 1 | 1 | 1 | 1 |
| L2 | 0.5 | 0.5 | 0.5 | 0.5 | 0.5 | 0.5 | 0.5 | 0.5 |
| Q | 1 | 2.5 | 5 | 7.5 | 10 | 15 | 20 | 1000 |

Range of Resistance in the Second Embodiment

The attenuation value of the attenuation band on the low frequency side of the pass band and the value of attenuation width (MHz) are set to sufficient values at practical levels. A preferable range of the resistance value to surely clear the conditions at that time is as follows:

1) The range of resistance is 0.20 to 1.20 (Ω) when L is nearly equal 1 (nH).
2) The range of resistance is 0.10 to 0.60 (Ω) when L is nearly equal 0.5 (nH).

Traditionally, as a scheme to obtain high attenuation characteristics, the response is that the bonding wire is used as the attenuation pole inductance L to form attenuation poles in the attenuation band as described in the related document.

The second embodiment according to the invention can obtain high attenuation characteristics in which the resistance component is used in addition to the bonding wire and thus the attenuation pole frequency and the attenuation characteristic can be varied without changing the pass band characteristics. Particularly, the improvement in the attenuation characteristic is significant, allowing a bandwidth of 20 (dB) to be a broad band.

Figure 10:
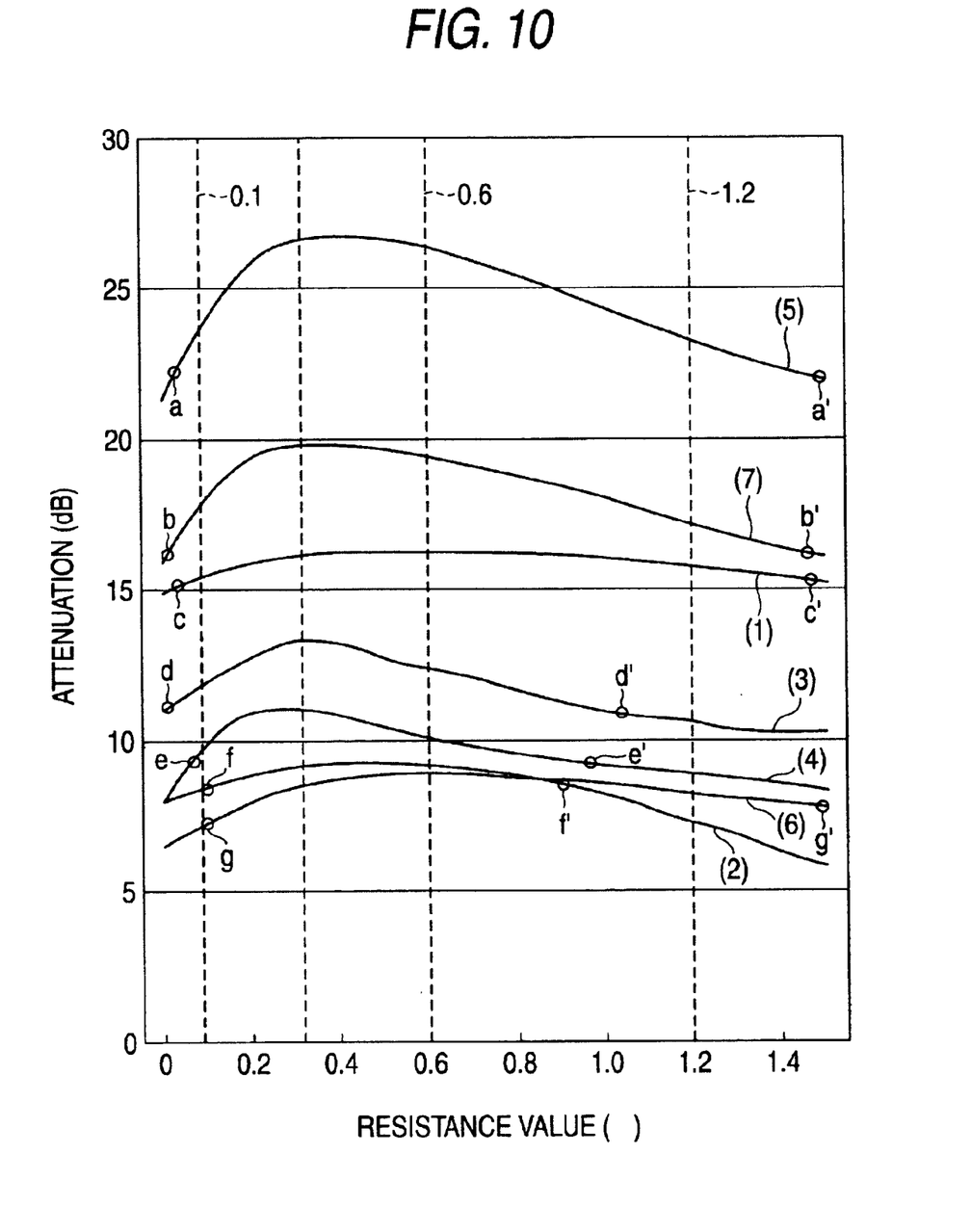
FIG. 10 is a graph summarizing the characteristics of Tables 2 and 4 of the invention.

Relationship Between the Attenuation Width and Resistance of the SAW Filter with Attenuation Poles FIG. 10 is a graph summarizing the characteristics of Tables 2 and 4 of the invention.

Characteristic curve (1) depicts Table 2-1-1.
Characteristic curve (2) depicts Table 2-1-2.
Characteristic curve (3) depicts the upper part of Table 4-2-1.
Characteristic curve (4) depicts the lower part of Table 4-2-2.
Characteristic curve (5) depicts the upper part of Table 4-2-2.
Characteristic curve (6) depicts the middle part of Table 4-2-2.
Characteristic curve (7) depicts the lower part of Table 4-2-2.

Points a, a', b, b', c, c', d, d', e, e', f, f', g and g' of each of the characteristic curves mean 'a predetermined value' expressing the interval where the attenuation value of the attenuation band on the low frequency side of the pass band continues at a predetermined value or below, meaning an effective range including the preferable ranges described above.

The conditions for good items are that the range of resistance is 0.1 to 0.6 (Ω) when the attenuation pole inductance L is nearly equal 0.5 (nH).

The conditions for good items are that the range of resistance is 0.1 to 1.2 (Ω) when the attenuation pole inductance L is nearly equal 1.0 (nH).

The attenuation pole impedance tends to broaden the range of resistance as the value of inductance L is increased.

The relationship between the inductance and resistance can be selected based on these characteristic curves.

As described above, the invention has high attenuation characteristics in the attenuation band on the low frequency side of the pass band.

The invention can obtain required characteristics in which the impedance having the real part is used in the two-port circuit for forming the pole frequency and high attenuation characteristics are provided by the real part of the resistance component along with impedance such as the bonding wire, as compared with the characteristics of the traditional ladder type SAW filter.

What is claimed is:

1. A surface acoustic wave filter with attenuation poles comprising:
   a two-port circuit for filtering, comprising a ladder type surface acoustic wave filter with a surface acoustic wave resonator; and
   a two-port circuit for impedance connected to the two-port circuit for filtering,
   wherein the impedance of the two-port circuit for impedance is configured so as to form an attenuation band of a predetermined width having a substantial attenuation characteristic on a low frequency side of a pass band, and wherein the two-port circuit for impedance comprises a bonding wire having a ratio of resistance to inductance of about 0.4 ohms per nH or less.

2. A surface acoustic wave filter with attenuation poles according to claim 1, wherein the two-port circuit for impedance further comprises an additional bonding wire.

3. A surface acoustic wave filter with attenuation poles according to claim 1, wherein two-port circuit for impedance further comprises a capacitance connected in parallel to one of the bonding wires.

4. A surface acoustic wave filter with attenuation poles comprising:
- a two-port circuit for filtering, comprising a ladder type surface acoustic wave filter with a surface acoustic wave resonator; and
- a two-port circuit for impedance connected to the two-port circuit for filtering,
- wherein the two-port circuit for impedance is configured as a $\pi$ type circuit having three impedances so as to form an attenuation band of a predetermined width having a substantial attenuation characteristic on a low frequency side of a pass band, and
- wherein the $\pi$ type circuit comprises a plurality of bonding wires, each of the bonding wires having an inductance of about 0.5 nH and a resistance of about 0.2 ohms or less.

5. A surface acoustic wave filter with attenuation poles comprising:
- a two-port circuit for filtering, comprising a ladder type surface acoustic wave filter with a surface acoustic wave resonator; and
- a two-port circuit for impedance connected to the two-port circuit for filtering,
- wherein the two-port circuit for impedance is configured as a $\pi$ type circuit having three impedances so as to form an attenuation band of a predetermined width having a substantial attenuation characteristic on a low frequency side of a pass band, and
- wherein the $\pi$ type circuit comprises a plurality of bonding wires, each of the bonding wires having an inductance of about one nH and a resistance of about 0.4 ohms or less.

6. A surface acoustic wave filter with attenuation poles comprising:
- a two-port circuit for filtering, comprising a ladder type surface acoustic wave filter with a surface acoustic wave resonator; and
- a two-port circuit for impedance connected to the two-port circuit for filtering,
- wherein the two-port circuit for impedance is configured as a $\pi$ type circuit having three impedances so as to form an attenuation band of a predetermined width having a substantial attenuation characteristic on a low frequency side of a pass band, and
- wherein the $\pi$ type circuit comprises a plurality of bonding wires, each of the bonding wires having about the same impedance and a ratio of resistance to inductance of about 0.4 ohms per nH or less.

* * * * *